United States Patent [19]
Pasquier

[11] Patent Number: 5,893,509
[45] Date of Patent: Apr. 13, 1999

[54] APPARATUS FOR MAKING WIRE CONNECTIONS ON SEMICONDUCTOR CHIPS

[75] Inventor: Laurent Pasquier, Zurich, Switzerland

[73] Assignee: ESEC SA, Cham, Switzerland

[21] Appl. No.: 08/837,369

[22] Filed: Apr. 17, 1997

[30]  Foreign Application Priority Data

Apr. 17, 1996 [CH] Switzerland .................. 1996 0973/96

[51] Int. Cl.⁶ .................................................. H05K 13/06
[52] U.S. Cl. .......................... 228/4.5; 228/5.5; 403/72; 403/220
[58] Field of Search .................. 228/4.5, 5.5, 1.1, 228/106, 180.5; 403/220, 223, 72, 119

[56]  References Cited

U.S. PATENT DOCUMENTS

| | | | |
|---|---|---|---|
| 2,641,434 | 6/1953 | Henshaw | 403/220 |
| 3,640,018 | 2/1972 | Light | 403/220 |
| 4,261,211 | 4/1981 | Haberland | |
| 4,571,688 | 2/1986 | Kashihara et al. | 228/1.1 |
| 4,598,853 | 7/1986 | Hill | |
| 4,903,883 | 2/1990 | Thurleman et al. | |
| 4,921,396 | 5/1990 | Asakawa et al. | 403/220 |
| 4,953,834 | 9/1990 | Ebert et al. | |
| 5,169,050 | 12/1992 | Montagu | |
| 5,302,044 | 4/1994 | Spariat et al. | 403/220 |
| 5,330,089 | 7/1994 | Orcutt et al. | 228/1.1 |
| 5,540,807 | 7/1996 | Akiike et al. | 228/1.1 |

FOREIGN PATENT DOCUMENTS

| | | |
|---|---|---|
| 1 334 446 | 8/1963 | France. |
| 2 309 009 | 11/1976 | France. |
| WO 84/03823 | 10/1984 | WIPO. |
| WO 85/05416 | 12/1985 | WIPO. |
| WO 88/04738 | 6/1988 | WIPO. |

*Primary Examiner*—Samuel H. Heinrich
*Attorney, Agent, or Firm*—McCormick, Paulding & Huber

[57]  ABSTRACT

In an apparatus known as a wire bonder, a new type of one-piece joint element (20) is used as the articulated link (G) between a support unit (pivoting rocker 30) and a bonding unit (10) that carries a capillary (12). One or more such joint elements (20) define a virtual pivot axis (A2) for the unit (10), which lies outside the unit and thus provides a passage in the apparatus wide enough for relatively wide workpieces (chips 1 on substrate 2). A joint element (20a) is made in one piece and has at least two elastically flexible blades (22a) converging toward each other relative to a symmetry plane (S), and the blades are connected to each other by two rigid sections (23a, 24a). One of the rigid sections (23a) is attached to (and removable from) the support unit (30), the other (24a) is attached to (and removable from) the bonding unit (10), so that the joint element (20) is easy to fit or exchange.

7 Claims, 2 Drawing Sheets

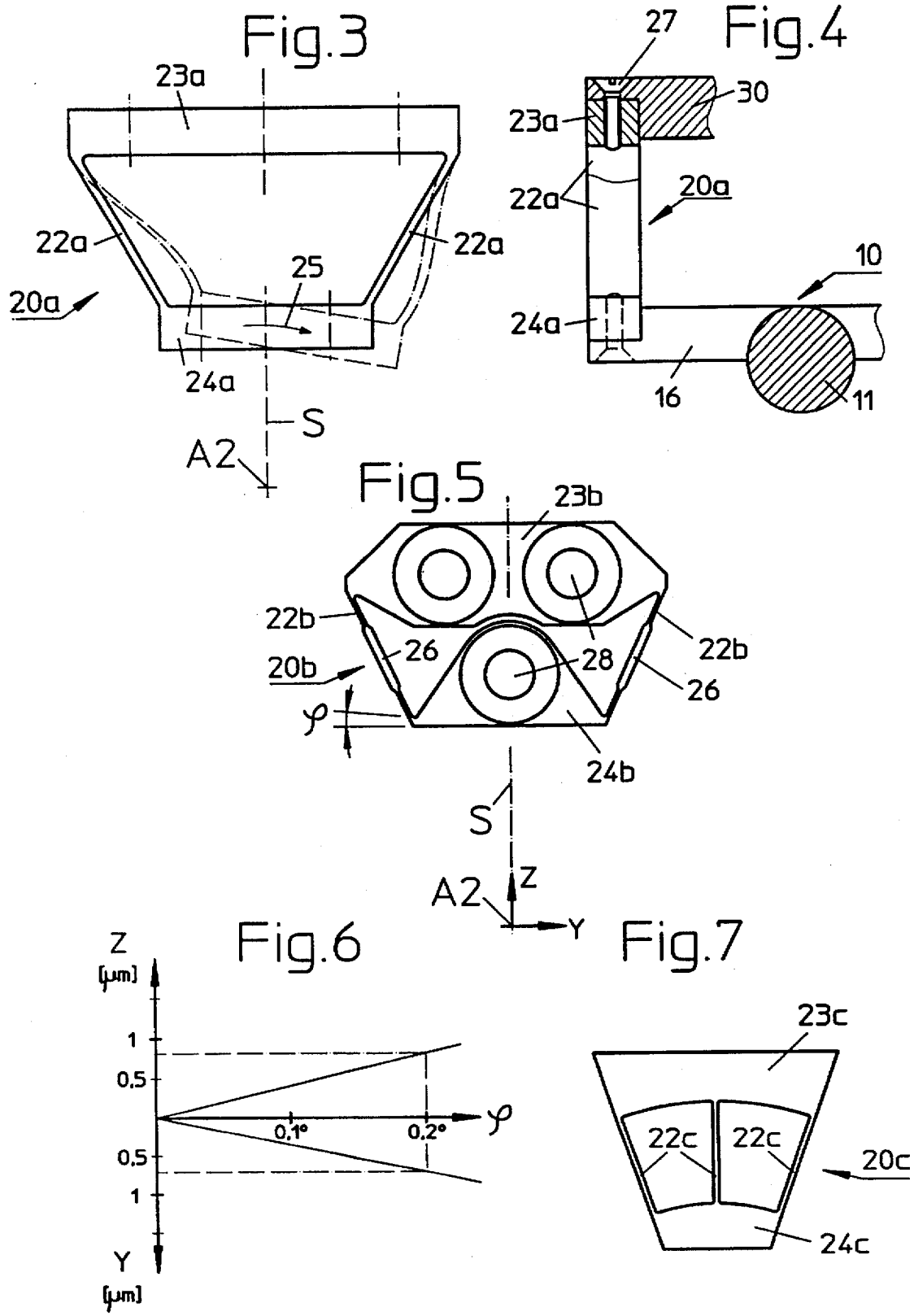

APPARATUS FOR MAKING WIRE CONNECTIONS ON SEMICONDUCTOR CHIPS

BACKGROUND OF THE INVENTION

The present invention relates to an apparatus for making wire connections on semiconductor chips. In semiconductor assembly, wire bridges are made by means of such an apparatus, generally known as a wire bonder, to form the electricalconnections to the integrated circuit on the chip. For this purpose, one wiring point for the bridge is on the chip's surface, the other on the substrate that supports the chip (e.g. a lead frame) or on another chip. Typically, ultrasonic welding is used in wire-bonding to attach the wire to the wiring points. For the present invention, the following components and characteristics are presupposed in such an apparatus:

- a bonding unit carrying a capillary which guides the bonding wire and is movable in a direction at least approximately perpendicular to the chip's surface;
- a support unit which carries the bonding unit and is guided to perform controlled motions parallel to the chip's surface; and
- resilient articulating means linking the bonding unit to the support unit and having at least one pair of converging, flexible blades arranged opposite each other in relation to a symmetry plane and defining a pivot axis which extends parallel to the chip's surface and lies outside the resilient articulating means.

PRIOR ART

U.S. Pat. No. 4,598,853 describes an apparatus of this kind. In U.S. Pat. No. 4,903,883 (corresponding to EP-A 0 340 506), another, similar such apparatus is disclosed, except that this differs from the aforesaid example of prior art in the design of the resilient articulating means that links the bonding unit to the support unit.

The chips assembled on a substrate, ready for bonding, are below the bonding unit and move forward in the apparatus at clocked intervals. To make a wire bridge, the support unit and the bonding unit carried by it perform coordinated, programmed movements to guide the capillary along its required trajectory by motion components parallel and perpendicular to the chip's surface; because chips are normally processed with their surface horizontal, the following will simply refer to horizontal and vertical movements. In wire-bonding, each time the capillary touches the chip or the substrate, the resilient articulating means that links the support unit to the bonding unit acts "passively": The bonding unit thereby pivots in a vertical plane by a small angle relative to the support unit and thus exerts the force necessary for bonding.—Resilient articulating means of the kind having an external or offset "virtual" pivot axis, i.e. an axis that has no pivot pin with bearings or suchlike, provide adequate clearance under the bonding unit to allow the passage of relatively wide workpieces. This makes it possible to process substrates with large-surface chips and long wire bridges, and also systems comprising several chips adjacent to one another, so-called multichip devices.

The movements described above are made at high speed and demand very high precision. In particular, the capillary's tip must not move horizontally as it touches the chip. In addition to great lateral stability in said resilient articulating means, this requires the resilient articulating means's pivot axis and the chip's or substrate's surface to lie in practically the same plane, so that the tangent to the capillary's vertical pivoting movement is as nearly as possible perpendicular to the chip's surface. If the support unit is designed as a pivoting rocker, as shown in U.S. Pat. No. 4,903,883 or EP-A 0 340 506, its pivot axis must also lie in the same plane.

The generic type of apparatus referred to, as described in U.S. Pat. No. 4,598,853, has leaf-spring sections bent to a truncated vee shape to form a pair of elastically flexible blades. The free ends of the blades are clamped into slots in the support unit, and the flat section between them is clamped by a separate component to the bonding unit. In the manufacture of such a system it is difficult to bend the leaf springs to shape with the requisite precision, and internal stresses in the material or changes in its structure inevitably occur. Moreover, difficulties arise in the insertion and attachment of the ends of the leaf springs in slots: It is very expensive and time-consuming to make such narrow slots that fit the thickness of the leaf springs, and even minute variations of the prescribed dimensions can cause considerable differences in the amount of tension produced and particularly in the effective length of the blades. Moreover, in continuous operation, the areas of attachment are subject to progressive plastic deformation because of the alternating elastic deflection of the blades, and this also causes changes in the clamped length. For these reasons, this known type of resilient articulating means is inherently rather unstable and, in particular, the spring properties and the position of the pivot axis are not easily reproducible.

SUMMARY OF THE INVENTION

A principal object of the present invention is to provide a novel and advantageous type of apparatus referred to, in order to overcome the disabilities of the resilient articulating means described. In particular, it proposes a superior type of resilient articulated link suitable for serial manufacture, with exactly reproducible properties that remain stable in continuous operation.

According to the invention, these and other objects are achieved in that at least two of said converging, elastic blades and two rigid sections that connect them, form a one-piece joint element consisting of a frame of essentially trapezoid shape, one of said rigid sections being removably attached to the support unit and the other being removably attached to the bonding unit.

Serial production of one-piece joint elements of this kind, having two or more converging blades, is readily achieved with the requisite accuracy and constant spring characteristics. Such uniform components also greatly simplify assembly of the apparatus; for example, the rigid sections of a joint element can be aligned and screwed into place on appropriate bearing surfaces of the support unit and the bonding unit respectively. The joint element as a whole is easy to replace. If necessary, it is also possible, simply by replacing the joint elements, for example to alter the position of the pivot axis.

Patent protection is claimed not only for the apparatus as defined above, but also for the individual one-piece joint element per se and in connection with potential other applications.

The invention is described below in greater detail, by reference to and in conjunction with the drawings, in connection with a typical embodiment of the apparatus and several typical embodiments of the joint element.

BRIEF DESCRIPTION OF DRAWINGS

FIG. 3 is a frontal view of a first typical embodiment of a joint element;

FIG. 4 is a partial side elevation, partially in section, of the joint element shown in FIG. 3, with a diagrammatic representation of a way it fits to the support unit and to the bonding unit;

FIG. 5 is a frontal view of a further and preferred embodiment of the joint element;

FIG. 6 is a diagram that refers to the embodiment shown in FIG. 5 and shows the position of the virtual pivot axis in relation to the pivot angle; and FIG. 7 is a frontal view of a third typical embodiment of the joint element.

DESCRIPTION OF THE PREFERRED EMBODIMENTS

Figure 1:
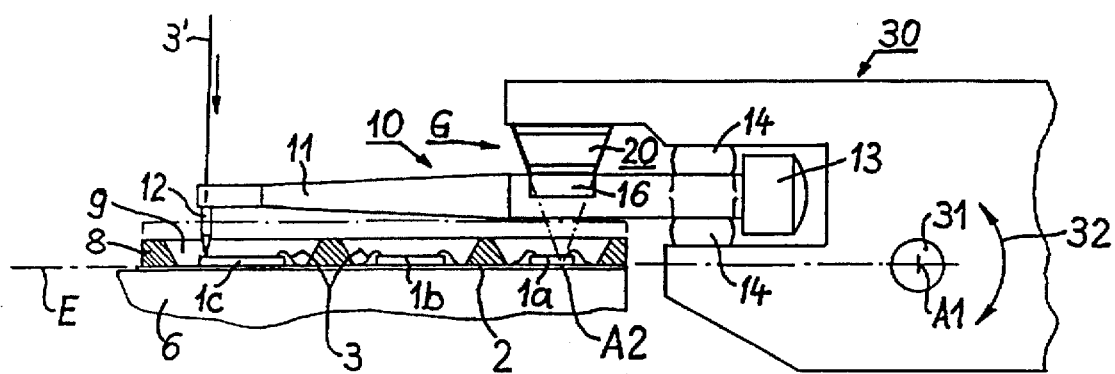
FIG. 1 is a greatly simplified partial representation of the apparatus in side elevation.
Figure 2:
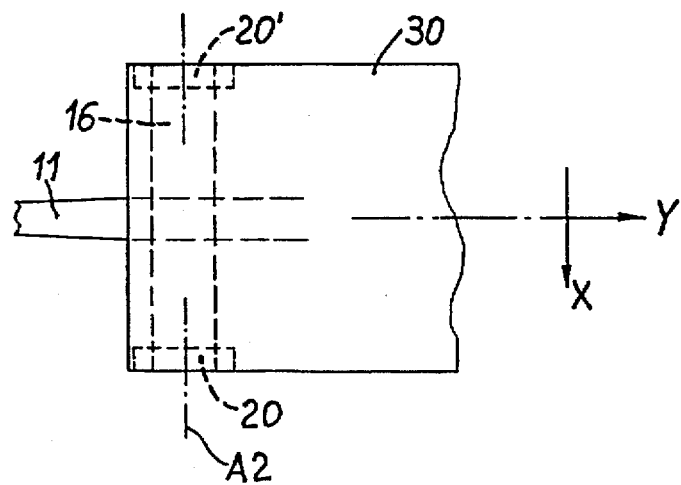
FIG. 2 is a plan view from above of parts of the apparatus shown in FIG. 1.

The greatly simplified diagrammatic representation in FIGS. 1 and 2 of a wire-bonding apparatus shows only the parts relevant to the present invention. Reference is made to the aforesaid U.S. Pat. No. 4,903,883 or EP-A 0 340 506 for further details that refer to prior art and not shown or described herein. The apparatus has a bonding unit 10 which in the present case is designed to make wire connections by ultrasonic welding. The main components of the unit 10 are a more or less horizontal horn 11 that carries an ultrasound generator 13 at one end and a capillary 12 at the other, said capillary guiding the bonding wire 3' that passes from above to below through the capillary's bore.

The bonding unit 10 is held by a support unit, only partly shown, that in the present example is designed as a rocker 30. A resilient articulating means G forms the link between the bonding unit 10 and the support unit (rocker 30). FIGS. 1 and 2 indicate this linking means diagrammatically only, but it is described in greater detail below in relation to a number of typical embodiments. Damping elements 14 are provided between the rocker 30 and the bonding unit 10 to suppress unwanted bounce oscillation and contribute to the force applied by the capillary 12 during wire-bonding.

Microprocessor-controlled motors (not shown), on the one hand, displace the rocker 30 and the bonding unit 10 in a horizontal plane parallel to the chip's surface (i.e. in X and Y, FIG. 2) and, on the other, pivot it about a horizontal axis A1 (pivot pin 31 and arrow 32, FIG. 1). As a result, the tip of the capillary 12 performs the coordinated movements necessary to form shaped wire bridges 3.

The workpieces for wire-bonding are under the bonding unit 10 and move forward transversely (in X) to the longitudinal reach of the horn 11 on a horizontal stage 6 of the apparatus. As an example, the drawing shows a substrate 2, such as a metal lead frame, with chips 1a, 1b, 1c assembled thereon. Each wire connection 3 is made by the capillary 12 between the surface of a chip 1 and the substrate 2, and also, if necessary, from chip to chip. The present example shows three (identical or different) chips 1a, 1b, 1c, in a row, that can be wire-bonded as long as the workpiece (substrate) remains in the same position. But such a preferred working method—and in some cases also the processing of large single chips—also requires a passage of adequate width in Y under the bonding unit 10. During processing the workpiece (substrate 2 with chips 1) is held flat on the stage 6 by a holding-down plate 8 equipped with "windows" 9. As indicated by the dash-dot line in FIG. 1, this plate 8 must be raised to let the workpiece advance.

Every time that the tip of the capillary 12 touches the surface of a chip 1 or of the substrate 2 during wire-bonding, the bonding unit 10 on the resilient articulating means G performs a vertical excursion at a slight angle against the rocker 30, namely about a second pivot axis A2, extending parallel to the rocker's first pivot axis A1 and situated between the rocker's axis and the capillary 12. As stated above, during this process the capillary must not move laterally (horizontally), i.e. the tangent of the pivot movement about the axis A2 must be as nearly as possible perpendicular to the workpiece. This in turn requires that the first axis A1, the second axis A2, and the workpiece all lie in a common plane E (FIG. 1) (the slight difference in height between the surfaces of the chip 1 and of the substrate 2 may be neglected).

The resilient articulating means G that links the bonding unit 10 to the rocker 30 is designed to place the pivot axis A2 it defines outside the resilient articulating means itself and beyond (i.e. under) the bonding unit 10. In other words, A2 is a "virtual" axis, not a material bearing with axle bolts or the like. Thus the working width or passage width of the apparatus is not limited by such a material bearing, but can also include the area of the virtual axis A2.

The resilient articulating means G should preferably have two joint elements 20, whose construction and function is described below by reference to various typical embodiments. As FIG. 2 indicates, two such joint elements 20, 20' are provided for the sake of lateral stability, placed on the two sides of the bonding unit 10, and with their pivot axes aligned. A traverse 16, for example, forms the link of each joint element 20, 20' to the bonding unit 10. In principle, however, a single, centrally positioned joint element 20 that links the rocker 30 directly to the bonding unit 10, i.e. without a traverse 16, would also do.

FIGS. 3 and 4 show a first typical embodiment of a one-piece joint element 20a. Such an element basically comprises two or more converging, elastically flexible blades 22a opposite each other relative to a symmetry plane S. At their one end the blades 22a are connected to a first rigid section 23a, and at their other to a second rigid section 24a, to form a one-piece component. Thus the joint element 20a is a one-piece article made as a closed and essentially trapezoid frame from a solid blank. As FIG. 4 shows, the rigid section 23a is attached to (and removable from) the support unit 30 by screws 27 and the rigid section 24a is similarly screwed to (and removable from) traverse 16 of the bonding unit 10.

It has been found that when the blades are bent, as indicated by the dash-dot lines in FIG. 3, they act as a kind of "elastic guides" that control the rigid section 24a in a rotational motion relative to the other rigid section 23a, in the direction shown by the arrow 25 in FIG. 3. This defines a virtual axis A2 that lies outside the joint element in the symmetry plane S on the side of the shorter blade distance, at the distance where the projected (imaginary straight) lines of the blades intersect. This is of course subject to the caveat that the blades must not be bent beyond the elastic limits of the blade material, i.e. the bending stresses must be kept within the permissible limits. The joint element thus makes it possible to obtain a resilient articulating means characterized by good positional constancy of the pivot axis, with only very slight translational motion superimposed on rotation; good mechanical stability, and, in addition, total freedom from friction and slack. FIG. 5 shows a different, preferred embodiment of a joint element 20b designed especially for use in an apparatus made in accordance with FIGS. 1 and 2. The one-piece spring element 20b is made of 2 mm thick flat material. The two converging blades 22b enclose an angle of 50° and have 0.15 mm thick end sections. The greater distance between the blades at the transition to the rigid section 23b is about 14.4 mm, and the shorter distance between the blades at the transition to the rigid section 24b is about 9.2 mm. The distance of the pivot axis A2 from the lower edge of the rigid section 24b is about 9.5 mm. The two rigid sections 23b and 24b have drilled holes 28 for removably attaching the spring element to the support unit (rocker 30) and the bonding unit 10 respectively.

The two blades 22b are stiffened by a thickened midsection 26, so that elastic bending occurs mainly in the end sections of the blades. Adequate stiffening could also be obtained by other means, for example by one or more longitudinal crimped beads extending along the blades. The main purpose of stiffening the blades is to increase their resistance to buckling. As FIG. 1 indicates, the bonding force applied by the capillary 12 by the excursion of the bonding unit 10 is in part produced by the spring action of the joint elements 20 and in (greater) part by deformation of the damping elements 14. It can be readily seen that in this process the blades are subjected to a buckling force, which the aforesaid stiffening is designed to resist.

The main mechanical properties of the joint element 20b shown in FIG. 5 have been determined in a computer model on the basis of the finite-elements method. In a typical case the required bonding force of the capillary 12 is obtained by a pivot excursion of 0.2° (angle φ, shown exaggerated in FIG. 5) of the bonding unit 10 and the joint element's rigid section 24b, relative to the rigid section 23b or rocker 30. The diagram in FIG. 6 shows, as a function of the angle φ, the vertical and horizontal displacement of the axis A2 (in Z and Y, FIG. 5) obtained. It has been found that the displacement in both directions is extremely small and practically linear relative to the pivot angle; when φ=0.20°, the displacement is less than 1 μm. Also the blade deformation that occurs is entirely within the elastic limits, i.e. reversible. Finally, FIG. 7 shows a further embodiment of a one-piece joint element 20c, in which three elastic converging blades 22c connect rigid sections 23c and 24c. The principle of how this joint element functions, with the blades acting as "elastic guides", is essentially the same as that of the embodiments shown in and described for FIGS. 3, 4 and 5. This further example is given only to demonstrate that it is also possible to provide more than two blades and that the mechanical properties, such as the spring constant, resistance to buckling, etc., can be dimensioned to suit specific requirements.

One-piece joint elements of the type described above (20a, 20b, 20c) can be serially produced with the requisite accuracy without special difficulty. A suitable production method, for example, is to make them from flat material, by using electro-erosive machining—also known as spark erosion, electric-spark machining, electrical-discharge machining (EDM), etc—to cut out the material within the closed frame by the well-known process known as wire erosion. In this process, the workpiece is placed in a bath that contains a dielectric liquid, a wire that acts as erosion electrode is guided in a vertical direction, and a feed movement transverse to the direction of the wire is produced along the required cutting line. The same method or normal machining may be used to shape the outer profile of the workpiece.

As indicated in the above description of typical embodiments, the resilient articulating means G, made up of one-piece joint elements 20, is very easy to fit and provides clearly reproducible, repeatable, and stable relations as regards the position of the pivot axis A2, spring properties, and so forth. It also makes it possible, whenever necessary, to replace the joint elements quickly and easily. The use of different types of such joint elements, with blades 22 at different angles of convergence, also permits changes in the position of the pivot axis A2, without any need to alter the fixing positions on the support unit 30 and on the bonding unit 10.

I claim:

1. An apparatus for making wire connections on semiconductor chips, comprising a bonding unit carrying a capillary which guides a bonding wire and is movable in a direction at least approximately perpendicular to the chip's surface;

a support unit carrying said bonding unit and guided to perform controlled movements parallel to the chip's surface; and resilient articulating means linking said bonding unit to said support unit and comprising at least one pair of converging, flexible blades arranged opposite each other relative to a symmetry plane and defining a pivot axis which extends parallel to the chip's surface and lies outside said resilient articulating means, characterized in that at least two of said converging, flexible blades and two rigid sections connecting them form a one-piece joint element consisting of a frame of essentially trapezoid shape, wherein one of said rigid sections is removably attached to said support unit and the other is removably attached to said bonding unit.

2. An apparatus according to claim 1, wherein each blade of said joint element is stiffened in a longitudinal midsection, preferrably by thickening.

3. An apparatus according to claim 1, wherein the resilient articulating means comprise two of said one-piece joint elements, placed on each side of the bonding unit with their respective pivot axes aligned with each other.

4. An apparatus according to claim 1, wherein said support unit is a rocker having a pivot axis extending parallel to said pivot axis of said resilient articulated means, the pivot axis of said rocker, the pivot axis of said resilient articulating means and said chip all lie in a common plane.

5. An apparatus according to claim 1, wherein said resilient articulating means are fabricated through electro-erosive machining.

6. A joint element having at least two converging, flexible blades arranged opposite each other relative to a symmetry plane and defining a pivot axis extending in said symmetry plane and outside the joint element, characterized in that said converging blades and two rigid sections connecting them form a one-piece and essentially trapezoid frame.

7. A joint element according to claim 6, wherein each blade is stiffened in a longitudinal mid-section, preferably by thickening.

* * * * *